United States Patent
Bortolotti et al.

(10) Patent No.: US 11,232,894 B2
(45) Date of Patent: Jan. 25, 2022

(54) METHOD FOR GENERATING A PLURALITY OF CURRENTS EACH HAVING A FREQUENCY

(71) Applicants: THALES, Courbevoie (FR); CENTRE NATIONAL DE LA RECHERCHE SCIENTIFIQUE, Paris (FR)

(72) Inventors: Paolo Bortolotti, Palaiseau (FR); Julien Kermorvant, Palaiseau (FR); Vincent Cros, Palaiseau (FR); Bruno Marcilhac, Palaiseau (FR); Romain Lebrun, Le Mans (FR)

(73) Assignees: THALES, Courbevoie (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 489 days.

(21) Appl. No.: 16/340,805

(22) PCT Filed: Oct. 11, 2017

(86) PCT No.: PCT/EP2017/075934
§ 371 (c)(1),
(2) Date: Apr. 10, 2019

(87) PCT Pub. No.: WO2018/069389
PCT Pub. Date: Apr. 19, 2018

(65) Prior Publication Data
US 2021/0280348 A1    Sep. 9, 2021

(30) Foreign Application Priority Data

Oct. 11, 2016 (FR) ..................... 16/01474

(51) Int. Cl.
*H01F 10/32* (2006.01)
*H03B 15/00* (2006.01)
(Continued)

(52) U.S. Cl.
CPC ....... *H01F 10/3254* (2013.01); *H01F 10/329* (2013.01); *H03B 15/006* (2013.01);
(Continued)

(58) Field of Classification Search
CPC ... H03B 15/006; B82Y 25/00; H01F 10/3254; H01F 10/329; H03L 7/24
See application file for complete search history.

(56) References Cited

U.S. PATENT DOCUMENTS 8,542,072 B2   9/2013   Dieny et al.
9,461,586 B2   10/2016  Locatelli et al.
(Continued)

FOREIGN PATENT DOCUMENTS

FR    2 944 384    10/2010
FR    2 977 999    1/2013
(Continued)

OTHER PUBLICATIONS

Quinsat, M., et al. "Injection locking of tunnel junction oscillators to a microwave current." Applied Physics Letters 98.18 (2011): 182503. (Year: 2011).*
(Continued)

*Primary Examiner* — Ryan Johnson
(74) *Attorney, Agent, or Firm* — Nixon & Vanderhye

(57) ABSTRACT

Disclosed is a method for generating, from a first electric current having a first frequency, a plurality of second currents each having a second respective frequency component, the method including the following steps: supplying a frequency distributor including a first set of pillars including a layer made from a first magnetic material and having a resonance frequency; exciting each pillar of the first set with an electromagnetic field having the first frequency, the ratio between twice the resonance frequency of each pillar of the first set and the first frequency being equal, to within ten
(Continued)

percent, to a first natural integer; and generating, by each pillar of the first set, a second frequency component in the second respective current.

20 Claims, 3 Drawing Sheets

(51) Int. Cl.
*H03B 25/00* (2006.01)
*H03L 7/24* (2006.01)
*H01P 5/12* (2006.01)

(52) U.S. Cl.
CPC ............... *H03B 25/00* (2013.01); *H03L 7/24* (2013.01); *H01P 5/12* (2013.01)

(56) References Cited

U.S. PATENT DOCUMENTS

| | | | |
|---|---|---|---|
| 2010/0321993 A1* | 12/2010 | Nikonov | H01F 10/3286 |
| | | | 365/171 |
| 2012/0075031 A1 | 3/2012 | Dieny et al. | |
| 2014/0218122 A1 | 8/2014 | Locatelli et al. | |
| 2016/0305994 A1 | 10/2016 | Kermorvant et al. | |

FOREIGN PATENT DOCUMENTS

| | | | |
|---|---|---|---|
| FR | 3 014 205 | 6/2015 | |
| WO | WO-2010100711 A1 * | 9/2010 | ............. H01L 27/22 |

OTHER PUBLICATIONS

International Search Report, PCT/EP2017/075934, dated Nov. 16, 2017.

* cited by examiner

METHOD FOR GENERATING A PLURALITY OF CURRENTS EACH HAVING A FREQUENCY

FIELD OF THE INVENTION

The present invention relates to a method for generating a plurality of currents each having a respective frequency component.

BACKGROUND OF THE INVENTION

The radiofrequency electromagnetic waves, also called radio waves, are the electromagnetic waves whose frequency is between 3 kiloHertz (KHz) and 100 GigaHertz (GHz). Radio waves are used in many applications. In particular, certain radio wave frequencies are attenuated very little by the Earth's atmosphere. Radio waves, and in particular radio waves whose frequency is greater than or equal to 3 MegaHertz (MHz), are very frequently used for applications of the telecommunications and/or radar type.

It is very common for a single device generating a radiofrequency electrical signal to power several separate apparatuses. For example, a signal received by a single receiver is frequently used simultaneously by several communication devices, or a reference radiofrequency signal is sometimes used during several parallel steps of a signal processing method.

It is thus desirable, from a single radiofrequency signal, to generate a plurality of separate radiofrequency signals to power these different apparatuses. The generated radiofrequency signals are, in most cases, intended to send the different apparatuses the same information from the receiver.

To that end, devices called distributors are present in many installations, and make it possible to generate, from a first radiofrequency signal, a set of signals (in general electric currents) bearing the same information, and in particular having the same frequencies as the original signal.

The distributors used are generally power dividers making it possible to distribute the current received at the input between different output ports. However, this type of distributor is cumbersome and complex to produce. Furthermore, an architecture of this type requires a significant decrease in the power of the output signals relative to the input signal, which risks resulting in a harmful loss of information. One or several amplifiers are generally used. This results in an increase in the bulk, complexity and cost of the system.

SUMMARY OF THE INVENTION

There is therefore a need for a method making it possible to generate a plurality of equivalent radiofrequency signals from an original radiofrequency signal, which is implemented more easily and decreases the dimensions of the device generating the signals.

To that end, proposed is a method for generating, from a first electric current including at least a first frequency component having a first frequency, a plurality of second currents each having a second respective frequency component, the method comprising a step for providing a frequency distributor including a first set of pillars, each pillar comprising a stack of layers superimposed in a stacking direction. The step comprises at least one free layer made from a first magnetic material, a fixed layer made from a second magnetic material, and a barrier layer made from a third nonmagnetic material, the barrier layer separating the free layer from the fixed layer in the stacking direction. The frequency distributor further comprises at least one control member capable of generating a second electric current, a coupling member, and a plurality of electrical output conductors, each electrical output conductor being able to supply an electrical device with a respective second electric current. Each pillar is able, when the pillar is passed through by a direct current and is not excited by the coupling member, to generate, in the direct current, a third frequency component having a frequency called resonance frequency of said pillar. The method further comprises a step for generating a plurality of second electric currents, each pillar of the first set being passed through by a respective second current in the stacking direction, a step for excitation, by the coupling member, of each pillar of the first set with an electromagnetic field having the first frequency, the ratio between twice the resonance frequency of each pillar of the first set and the first frequency being equal, to within ten percent, to a first natural integer, a step for the generation, by each pillar of the first set, of a second frequency component in the second respective current, and a step for the supply, with each second current, of a corresponding electrical device by a respective output conductor.

According to specific embodiments, the generating method comprises one or more of the following features, considered alone or according to any technically possible combinations:

- each pillar has a first dimension in a first direction and a second dimension in a second direction perpendicular to the first direction, the first direction and the second direction each being perpendicular to the stacking direction, the first dimension and the second dimension each being strictly between 20 nanometers and 5 micrometers.
- the first material has a first magnetization, the method further comprising a step for temporal variation of the first magnetization of the free layer of at least one pillar, with the resonance frequency of the corresponding pillar.
- the first frequency component has a first amplitude, the second frequency component has a second amplitude, and the transfer function is defined for each pillar as being the ratio, in absolute value, of the first amplitude and the second amplitude, the transfer function being a function at least of the first frequency and having a plurality of local maxima, each local maximum corresponding to a third frequency equal, to within ten percent, to the ratio between twice the resonance frequency of the pillar and a second natural integer.
- the resonance frequency of each pillar of the first set is equal to the resonance frequency of each other pillar of the first set, the first natural integer preferably being equal to one.
- the frequency distributor further includes a second set of pillars, the resonance frequency of each pillar of the second set being identical to the resonance frequency of each other pillar of the second set, for each pillar of the second set, the difference between the resonance frequency of a pillar of the second set and the resonance frequency of a pillar of the first set being greater in absolute value, to within ten percent, than the resonance frequency of each pillar of the first set.
- the first set includes at least a first pillar having a first resonance frequency and a second pillar having a second resonance frequency, the ratio between twice the first resonance frequency and the first frequency being equal, to within ten percent, to a third natural integer, and the ratio between twice the second resonance frequency and the first frequency being equal, to within ten percent, to a fourth natural integer different from the third natural integer.

the first material comprises at least one element chosen from the group made up of Co, Ni and Fe.

the coupling member comprises an electric coupling conductor configured to be traveled by the first current, the coupling conductor and at least one pillar being superimposed in the stacking direction.

each pillar is cylindrical with a circular base, each pillar having a generatrix parallel to the stacking direction.

BRIEF DESCRIPTION OF THE DRAWINGS

Features and advantages of the invention will appear more clearly upon reading the following description, provided solely as a non-limiting example, and done in reference to the appended drawings, in which.

DETAILED DESCRIPTION OF PREFERRED EMBODIMENTS

Figure 1:
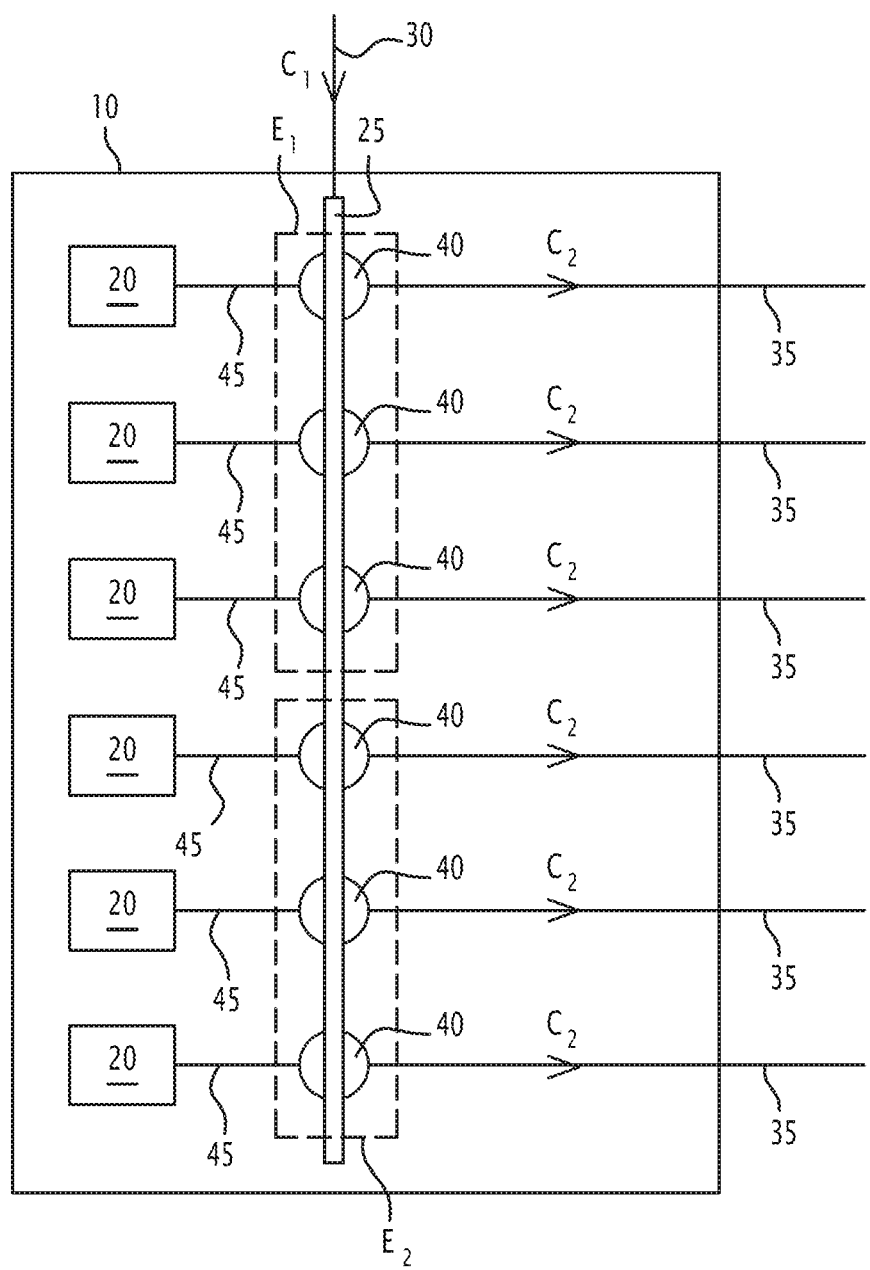
FIG. 1 is a schematic illustration of a first example frequency distributor comprising a plurality of pillars.

A frequency distributor 10 is shown in FIG. 1.

The frequency distributor 10 is able to receive a first electric current C1 as input, and to generate, from the first electric current C1, a plurality of second currents C2.

The frequency distributor 10 comprises a substrate 15, at least one control member 20, a coupling member 25, an electrical input conductor 30, a plurality of electrical output conductors 35, a first set E1 of pillars 40, a second set E2 of pillars 40 and a plurality of electrical connecting conductors 45.

The substrate 15 has an upper face Fs. The upper face Fs is planar.

There is defined, for the substrate 15, a stacking direction Z perpendicular to the upper face Fs of the substrate 15.

There is further defined, for the substrate 15, a first direction X and a second direction Y. The first direction X is perpendicular to the stacking direction Z. The second direction Y is perpendicular to the stacking direction Z. The second direction Y is further perpendicular to the first direction X.

Each control member 20 is configured to generate a second electric current C2. Each control member 20 is electrically connected to a pillar 40 by the corresponding electrical connecting conductor 45.

Alternatively, the control member 20 is configured to generate a plurality of second electric currents C2 and to deliver each second electric current C2, through a respective electrical connecting conductor 45, to a corresponding pillar 40. The frequency distributor 10 then comprises a single control member 20.

The coupling member 25 is electrically connected to the electrical input conductor 30.

The coupling member 25 comprises an electrical coupling conductor 47.

The electrical coupling conductor 47 is able to allow the circulation of the first current C1.

Preferably, the electrical coupling conductor 47 is made in the form of a rectangular band. The electrical coupling conductor 47 has at least one face perpendicular to the stacking direction Z.

The electrical coupling conductor 47 has a width measured in the first direction X and a height measured in the stacking direction Z.

The width of the electrical coupling conductor 47 is between 1 µm and 30 µm. The height of the electrical coupling conductor 47 is between 100 nm and 500 nm.

The electrical coupling conductor 47 is for example made from gold.

The electrical coupling conductor 47 and at least one pillar 40 are superimposed in the stacking direction Z. Preferably, each pillar 40 separates at least one portion of the electrical coupling conductor 47 from the substrate 15.

The input conductor 30 is able to receive the first current C1 and to transmit the first current C1 to the coupling member 25.

Each output conductor 35 is able to receive the second electric current C2 from a corresponding pillar 40. Each output conductor 35 is able to deliver the second electric current C2 to electronic device.

For example, each output conductor 35 comprises a capacitor.

Each electronic connecting conductor 45 is able to transmit a second current C2 from the control member 20 to the corresponding pillar 40.

The connecting conductor 45 is partially delimited by the corresponding pillar 40 and by the substrate 15.

Each electrical connecting conductor 45 is for example made in the form of a rectangular band. Each electrical connecting conductor 45 has at least one face perpendicular to the stacking direction Z.

Each electrical connecting conductor 45 is for example made from gold.

Alternatively, each electrical connecting conductor 45 is for example made from copper.

As an optional addition, an attachment layer allowing better mechanical holding separates each electrical connecting conductor 45 from the corresponding pillar 40.

The first set E1 of pillars 40 comprises at least one pillar 40.

Preferably, the first set E1 of pillars 40 comprises several pillars 40. According to the example of FIG. 1, the first set E1 of pillars 40 comprises three pillars 40.

The second set E2 of pillars 40 comprises at least one pillar 40.

Preferably, the second set E2 of pillars 40 comprises several pillars 40. According to the example of FIG. 1, the second set E2 of pillars comprises three pillars 40.

The term "pillar" is used in the microelectronics or nanoelectronics field to refer to a micrometric or nanometric three-dimensional structure with a flat apex borne by the substrate 15. For a three-dimensional structure, the term "micrometric" is understood to mean that the structure has at least one dimension smaller than or equal to 100 micrometers (µm). For a three-dimensional structure, the term "nanometric" is understood to mean that the structure has at least one dimension smaller than or equal to 100 nanometers (nm).

Each pillar 40 is delimited, in the stacking direction Z, by a first face 50 and by a second face 55. The second face 55 is in contact with the upper face Fs of the substrate 15. Each pillar 40 is further delimited in a plane perpendicular to the stacking direction Z by at least one side face 60.

The first face 50 is planar. The first face 50 is perpendicular to the stacking direction Z.

The second face 55 is planar. The second face 55 is perpendicular to the stacking direction Z.

The side face 60 is perpendicular to the first face 50 and to the second face 55.

Each pillar 40 has a first dimension in the first direction X, a second dimension in the second direction Y and a height in the stacking direction Z.

The first dimension is strictly between 20 nm and 5 µm. The second dimension is strictly between 20 nm and 5 µm.

The height of each pillar is between 5 nm and 2 µm

For example, each pillar 40 is cylindrical with a circular base. The term "cylindrical" means that each pillar 40 is defined by two parallel planes and by a surface delimited by all of the straight lines parallel to a straight line called generatrix of the cylinder and intersecting a closed curve, called guide curve of the cylinder.

The guide curve of each pillar 40 is circular.

As an optional addition, the generatrix of each pillar 40 is parallel to the stacking direction Z.

Each pillar 40 has a diameter measured in a plane perpendicular to the stacking direction Z. The diameter of each pillar 40 is between 20 nm and 5 µm.

Each pillar 40 includes a stack 65 of layers superimposed in the stacking direction Z and a passivation layer 70.

Each pillar 40 is configured to receive the corresponding second current C2 from the connecting conductor 45 and to deliver the second current C2 to the corresponding electrical output conductor 35.

The stack 65 comprises a free layer 75, a fixed layer 80 and a barrier layer 85.

The free layer 75 is made from a first magnetic material M1.

In the remainder of this description, the term "magnetic material" refers to a material having a magnetization oriented in a specific magnetization direction. This means that the material comprises a plurality of magnetic moments, and the resultant of the magnetic moments is a non-nil vector. The magnetization direction is defined as the direction of the resultant of the magnetic moments. The magnetic moments are for example carried by electrons present in the material.

In particular, the term "magnetic material" will be used for a ferromagnetic material or a ferrimagnetic material.

In a ferromagnetic material, the magnetic moments are oriented parallel to one another. When a ferromagnetic material is subjected to an outside magnetic field, the magnetic moments of the material orient themselves, while remaining parallel to one another, in the direction of the outside magnetic field.

In a ferrimagnetic material, the magnetic moments are oriented antiparallel to one another, without perfectly offsetting one another.

The resultant of the moments in a ferrimagnetic material is strictly less than the resultant of the moments in this same material, if the material in question was ferromagnetic. When a ferrimagnetic material is subjected to an outside magnetic field, the magnetic moments of the material orient themselves, while remaining antiparallel to one another, such that the resultant is oriented in the direction of the outside magnetic field.

The first magnetic material M1 is for example a ferromagnetic material.

A large number of ferromagnetic materials comprise Cobalt (Co), Iron (Fe) and/or Nickel (Ni). For example, the first material M1 is an alloy of several elements, at least one of which is chosen from the group made up of Co, Fe and Ni.

Preferably, the first material M1 is chosen from the group made up of Co, Fe and Ni, and alloys thereof. For example, the first material M1 is Permalloy, NiFe. Alternatively, the first material M1 is an alloy of Co, Fe, or an alloy of Co, Fe and Boron.

The free layer 75 has a first magnetization A1.

The first magnetization A1 is variable. This means that the free layer 75 is configured so that the first magnetization A1 varies over time.

For example, the free layer 75 is configured so that the first magnetization A1 is modified by applying an electromagnetic field to the pillar 40 in question. More specifically, the orientation of each magnetic moment of the free layer 75 can vary under the effect of the electromagnetic field.

The free layer 75 is substantially planar. In the context of this description, "substantially planar" means that the layer in question has a width in the first direction X, a length in the second direction Y, and a thickness in the stacking direction Z, and that the length and the width of the layer in question are each greater than or equal to ten times the thickness of the layer in question.

The free layer 75 has a first thickness e1. The first thickness e1 is for example between 1 nm and 30 nm.

The free layer 75 is at least partially delimited, in the stacking direction Z, by the passivation layer 70 and by the barrier layer 85.

Figure 2:
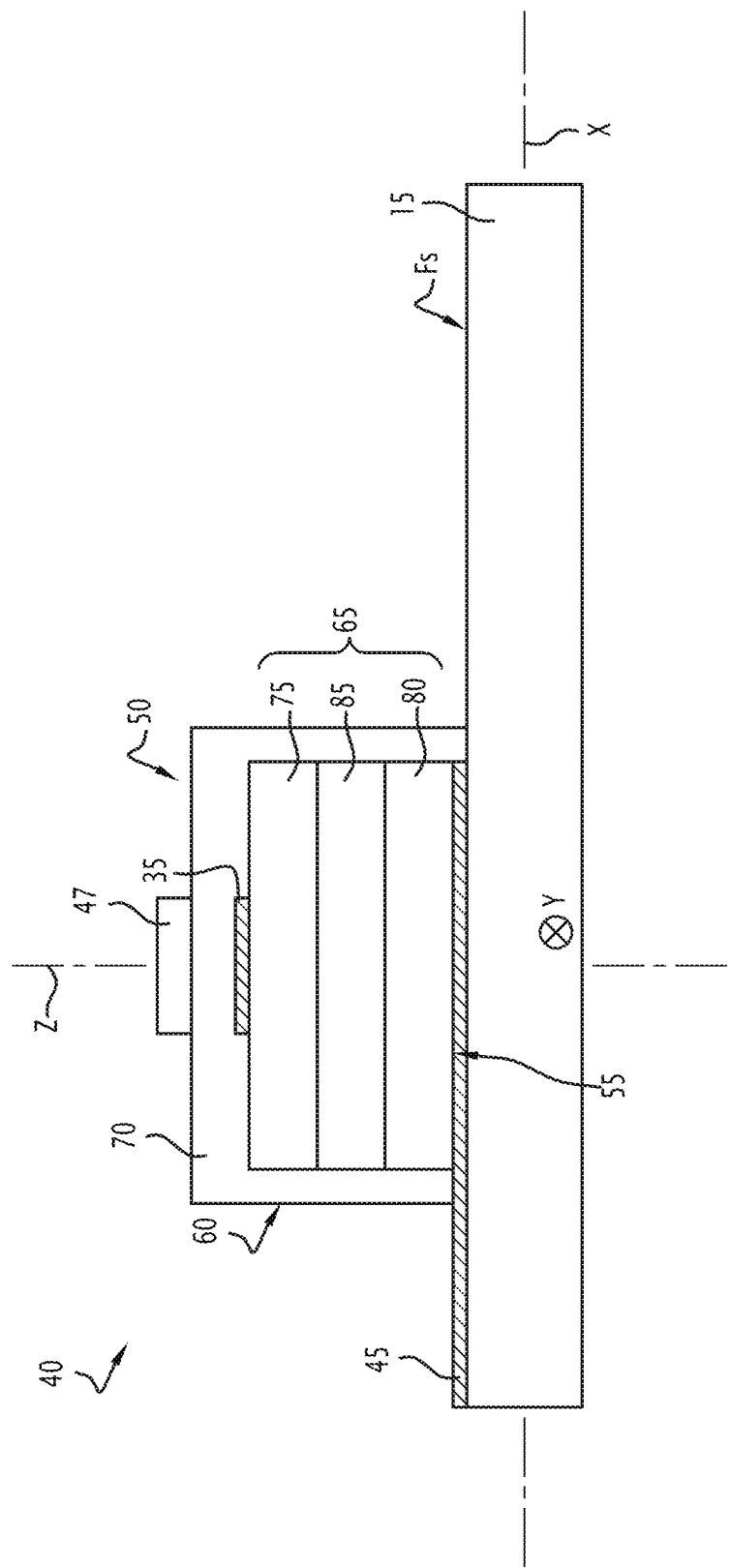
FIG. 2 is a sectional view of a pillar of FIG. 1.

According to the example of FIG. 2, the free layer 75 is in electrical contact with the electrical output conductor 35. The electrical output conductor 35 is for example partially received between the free layer 75 and the passivation layer 70.

The fixed layer 80 has a second magnetization A2. The second magnetization A2 is fixed. This means that the orientation of the second magnetization A2 is invariant over time.

The fixed layer 80 is made at least partially from a second magnetic material M2. For example, the fixed layer comprises two layers of a ferromagnetic material separated from one another by a layer of ruthenium.

The fixed layer 80 is substantially planar.

The fixed layer 80 has a second thickness e2. The second thickness e2 is for example between 1 nm and 30 nm.

The fixed layer 80 is delimited, in the stacking direction Z, by the barrier layer 85 and the connecting conductor 45.

The barrier layer 85 is substantially planar.

In the stacking direction Z, the barrier layer 85 separates the fixed layer 80 and the free layer 75.

The barrier layer 85 is made from a nonmagnetic material.

Preferably, the barrier layer 85 is made from a nonmagnetic and electrically insulating material. The barrier layer 85 is for example made from magnesium oxide (MgO).

The barrier layer 85 is able to be passed through by the second current C2 by total effect.

The barrier layer 85 has a third thickness e3. The third thickness e3 is for example between 0.5 nm and 5 nm.

The passivation layer 70 is able to electrically and chemically isolate the stack 65 from the outside of the passivation layer 70. For example, the passivation layer 70 is a conform layer covering the stack 65. A conform layer is a layer having a uniform thickness, and the shape of which reproduces the shape of a structure covered by the conform layer.

The passivation layer 70 is made from a fourth material M4. The fourth material M4 is an oxide. Preferably, the fourth material M4 is silicon oxide $SiO_2$. Silicon oxide $SiO_2$ is an insulating material frequently used in the microelectronics field.

Figure 3:
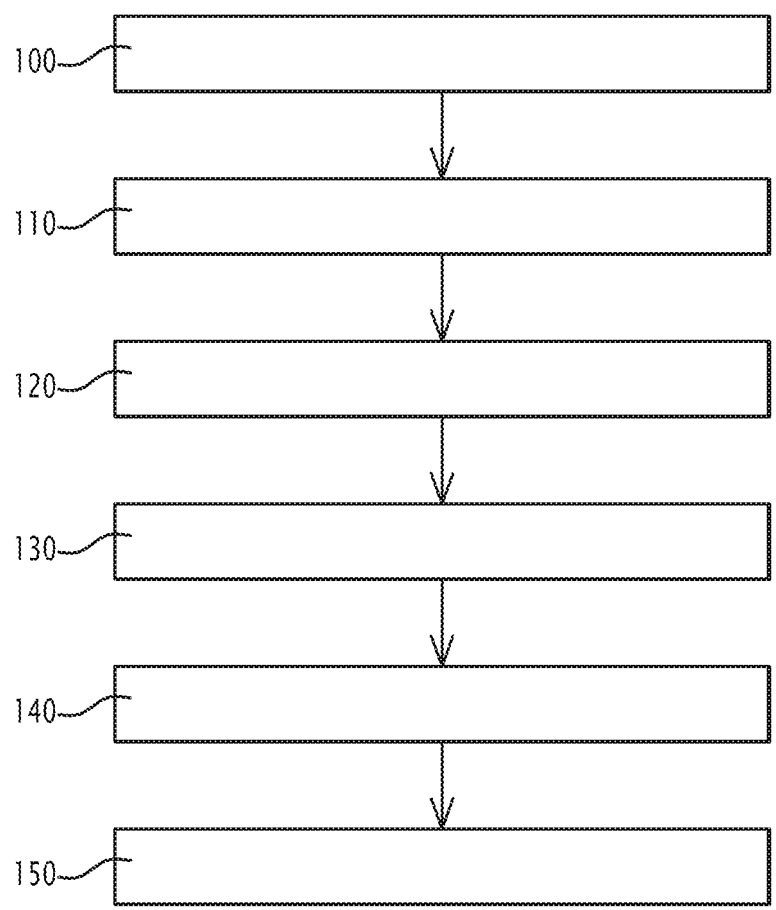
FIG. 3 is a flowchart of a frequency distribution method implemented by the frequency distributor of FIG. 1.

A flowchart of a first example method for generating a plurality of second currents C2 is shown in FIG. 3.

The method comprises a step 100 for providing a frequency distributor 10 as described above, a step 110 for generating a plurality of second currents C2, a step 120 for temporal variation of the first magnetization A1, an excitation step 130, a step 140 for generating a second frequency component c2 and a step 150 for supplying an electronic device.

During the supply step 100, a frequency distributor 10 is supplied. For example, during the supply step 100, the frequency distributor 10 is manufactured by using thin layer deposition techniques and etching techniques. Preferably, the frequency distributor 10 is integrated into an electronic installation comprising a plurality of electronic devices that the frequency distributor 10 is able to supply each with a corresponding second current C2.

During the supply step 100, the first current C1 is further transmitted to the input conductor 30.

The first current C1 has a first voltage U1 and a first intensity I1. The first current C1 has a first frequency component c1.

For an electric current, the term "having a set of frequency components" means that there is at least one breakdown of the current in which the current is the sum of several currents, at least one of which is a sinusoidal current. Each frequency component has a voltage and an intensity, which are each calculated mathematically by a Fourier transform of the voltage or the intensity of the current.

The first frequency component c1 is a radiofrequency component having a first frequency f1 between 3 MHz and 100 GHz.

The first frequency component c1 has a first amplitude a1.

In the remainder of this description, the amplitude of a variable property, such as a voltage or an intensity of a frequency component, is defined as the difference between the maximum value and the minimum value of the property, in absolute value.

During the generating step 110, at least one second current C2 is generated by the corresponding control member 20.

Each second current C2 has a second intensity I2. Each second current C2 is sent, by the corresponding connecting conductor 45, to a respective pillar 40.

Each second current C2 is a direct current. For example, the control member 20 imposes a constant value of the second intensity I2.

Each second current C2 passes through the corresponding pillar 40 in the stacking direction Z. Each pillar 40 of the first set E1 and each pillar 40 of the second set E2 are therefore passed through by a corresponding second current C2.

An electric resistance R is defined for each pillar 40 as being the electric resistance perceived by the corresponding second current C2 when the second current C2 passes through the pillar 40.

During the variation step 120, the first magnetization A1 of the free layer 75 of each pillar 40 of the first set E1 and the second set E2 is modified over time.

More specifically, the magnetic moments present in the free layer 75 are set in motion, to the point of resulting in a temporal variation of the first magnetization A1. For example, the amplitude of the first magnetization A1 varies periodically over time. Preferably, the orientation of the first magnetization A1 varies periodically over time.

In practice, the periodic temporal variation is obtained by the creation, in the free layer 75, of a magnetic configuration in which the orientation of the magnetic moments is, at a given moment, nonuniform. For example, the periodic temporal variation is a set of at least one spin wave.

The magnetic configuration of the free layer 75 is obtained owing to the second current C2.

By "spin transfer coupling" effect, a spin wave SW is generated in the free layer 75.

For example, the magnetic moments each undergo a precession movement around a mean direction. The precession movement is reflected by a local variation of the direction of the first magnetization A1 of the first magnetic material M1. The local deviation of the magnetization can propagate in the first magnetic material M1 in the form of a wave called "spin wave" SW.

The spin wave SW is for example a stationary wave. A stationary wave is the phenomenon resulting from the simultaneous propagation in different directions of several waves with a same frequency, in the same physical medium, that forms a figure, certain elements of which are fixed in time. Instead of seeing a wave that propagates in this, one sees a stationary vibration, but of different intensity, at each observed point.

Alternatively, the free layer 75 has a vortex configuration of the first magnetization A1 in which the magnetic moments are oriented perpendicular to the stacking direction Z and wind around the center of the free layer 75, except in a central region of the free layer 75. In the central region, the magnetic moments are not perpendicular to the stacking direction Z.

The variation of the first magnetization A1 has a resonance frequency f0. The resonance frequency f0 is a characteristic frequency of the configuration of the magnetic moments in the free layer 75. For example, the resonance frequency f0 is the frequency of the spin wave.

The resonance frequency f0 depends, inter alia, on the nature of the first material M1, the diameter of the pillar f0, and the thickness of the free layer 75.

The resonance frequency f0 of each pillar 40 of the first set E1 is equal to the resonance frequency f0 of each other pillar 40 of the first set E1. For example, the resonance frequency f0 of each pillar 40 of the first set E1 is equal to 1 GHz.

The resonance frequency f0 of each pillar 40 of the second set E2 is equal to the resonance frequency f0 of each other pillar 40 of the second set E2.

Preferably, the resonance frequency f0 of each pillar of the second set E2 is located outside a frequency interval centered on the resonance frequency f0 of each pillar 40 of the first set E1 and twenty percent wide of the resonance frequency of each pillar 40 of the first set E1. For example, the resonance frequency f0 of each pillar 40 of the second set E2 is equal to five quarters of the resonance frequency f0.

The free layer 75, the fixed layer 80 and the barrier layer 85 form a magnetic tunnel junction. This means that the resistance R of each pillar 40 is able to be modified by changing the magnetization of the free layer 75 and/or changing the magnetization of the fixed layer 80.

According to the "tunnel magnetoresistance" effect, the electric resistance R of each pillar 40 depends on the angle between the first magnetization A1 and the second magnetization A2. The second magnetization A2 being fixed, the electric resistance R therefore depends on the orientation of the magnetic moments of the free layer 75 of the pillar 40 in question.

When the second current C2 passes through a free layer 75 whereof the first magnetization A1 varies periodically, in the absence of an electromagnetic field, by "tunnel magnetoresistance" effect, the resistance R of the pillar 40 in question varies over time with the resonance frequency f0 of the pillar 40 in question.

During the creation step 120, each pillar 40 then generates, in the corresponding second current C2, a third frequency component c3. The third frequency component c3 has the resonance frequency f0 of the pillar 40. The second current C2 is then not a direct current, but a periodic current.

During the excitation step 130, the first current C1 is received by the electric input conductor 30. The first current C1 is transmitted by the electric input conductor 30 to the coupling member 25. Preferably, the electric input conductor 30 transmits the first current C1 to the electric coupling conductor 47.

The electrical coupling conductor 47 is passed through by the first current C1. The electric coupling conductor 47 then generates an electromagnetic field EM. Since the first current C1 has the first frequency component c1, the electromagnetic field EM has the first frequency f1.

The electromagnetic field EM has a wavelength A defined as the ratio between the velocity c of light in a vacuum and the first frequency f1.

For example, the coupling member 25 is distant from each pillar 40 by a maximum distance smaller than the wavelength A. The maximum distance is defined as the distance between the point of the coupling member closest to the pillar 40 and the point of the pillar 40 furthest from the coupling member.

The electric coupling conductor 47 excites at least one portion of each pillar 40 with the electromagnetic field EM. For example, the electric coupling conductor 47 excites the free layer 75 with the electromagnetic field EM.

The term "excite" means that, when a pillar 40 is passed through by the corresponding second electric current C2, at least one property of the second electric current C2 is modified when the pillar 40 is subjected to the electromagnetic field EM relative to the same property when the pillar 40 is not subjected to the electromagnetic field EM. For example, when the pillar 40 is subjected to the electromagnetic field EM, an intensity of the second current C2 and/or a voltage of the second current C2 are modified.

The first frequency component c1 has a first frequency f1 equal, to within 10%, to the ratio between twice the resonance frequency f0 of each pillar 40 of the first set E1 and a first natural integer n1. This is written mathematically as:

$$f1 = \frac{2f_0}{n1} \pm 0,1 * \frac{2f_0}{n1} \quad \text{(Equation 1)}$$

Preferably, the first natural integer n1 is equal to one. In this case, the first frequency f1 is equal to twice the resonance frequency f0 of each pillar 40 of the first set E1.

During the step 140 for generating a second frequency component, a second frequency component c2 is generated by each pillar 40 of the first set E1, by parametric effect and by resonance, in the corresponding second current C2.

Each second frequency component c2 is a radiofrequency component having a second frequency f2 between 3 MHz and 100 GHz.

Each second frequency component c2 has a second amplitude a2.

Each second frequency component c2 has a second frequency f2 equal to the resonance frequency f0 of the corresponding pillar 40.

The existence, in the second current C2, of the second frequency component c2, means that the second current C2 is then a periodic current and no longer a direct current.

The parametric effect mixed with the traditional resonance results, during the excitation of a system having a resonance frequency, in the appearance of a response of the system to the resonance frequency when the excitation is done with a frequency close to a multiple of the half-resonance frequency of the system.

Here, via the excitation of each pillar 40 of the first set E1 by the electromagnetic field EM having a first frequency f1 equal, to within 10%, to twice the resonance frequency f0 of each considered pillar 40, a second frequency component c2 having the resonance frequency f0 of each pillar 40 of the first set E1 is generated in each corresponding second current C2.

The first magnetization A1 of the free layer 75 of each pillar 40 is modified by the electromagnetic field EM. The electromagnetic field EM exerts, on each magnetic moment of the free layer 75, a rotational torque that modifies the orientation of each magnetic moment. The direction of the magnetization A1 is then modified.

"Tunnel magnetoresistance" effect means that the electric resistance R of each pillar 40 is modified by the electromagnetic field EM. Since the electromechanical field EM has the first frequency f1, which is a multiple of the resonance frequency f0 of each pillar 40 of the first set E1, by parametric effect, the electric resistance R of each pillar 40 of the first set E1 varies with the considered resonance frequency f0.

The second frequency f2 of the second frequency component c2 generated by each pillar 40 of the first set E1 is therefore equal to the resonance frequency f0 of each pillar 40 of the first set E1.

A transfer function F is defined for each pillar 40 as being the ratio, in absolute value, between the first amplitude a1 and the second amplitude a2 of the corresponding second frequency component C2. The transfer function F is a function at least of the first frequency f1.

By parametric effect, the transfer function F of each pillar 40 has a plurality of local maxima each corresponding to a respective third frequency f3.

Each third frequency f3 is equal, to within ten percent (%), to the ratio between twice the resonance frequency f0 of the pillar 40 in question and a second natural integer n2. This is written mathematically as:

$$f_3 = \frac{2f_0}{n2} \pm 0,1 * \frac{2f_0}{n2} \quad \text{(Equation 2)}$$

The transfer function F is a continuous function. Each maximum therefore has a non-nil width. Each maximum has a full width at half maximum less than or equal to 1% of the third frequency f3. For example, the full width at half maximum is less than or equal to 0.1% of the third frequency f3. The full width at half maximum is a parameter defined for many functions that may represent such a peak, such as the Lorentzian function.

Preferably, each full width at half maximum is less than or equal to 1 megahertz (MHz).

Owing to the parametric effect, the second amplitude a2 has a value much higher than the value that the second amplitude a2 would have if the first frequency was not equal, to within 10%, to a third frequency f3 of the pillar 40 in question.

Since the first frequency f1 is not equal, to within 10%, to a third frequency f3 of the pillars 40 of the second set E2, no second frequency component c2 is generated by the pillars 40 of the second set E2.

During the supply step 150, each second current C2 is delivered by the corresponding pillar 40, through the corresponding electric output conductor 35, to a respective electronic device.

The amplitude of each generated second frequency component c2 depends on the intensity 12 of the corresponding second current C2. The method therefore allows better control of the power of the signal with which each electronic device is supplied, through the choice of the intensity 12 of the second current C2.

Furthermore, the frequency distributor 10 is smaller than the power dividers of the state of the art. Furthermore, in the example operation above, the first frequency f1 is equal to a third frequency f3 of the pillars 40 of the first set E1, which therefore each generate a second frequency component c2. However, if the first frequency f1 had been equal to a third frequency f3 of the pillars 40 of the second set E2, a second frequency component c2 would have been generated by each of the pillars 40 of the second set E2, and sent to the corresponding electric output conductor 35.

The method allows easy control of the distribution of the generated signals to different devices based on the first frequency f1.

Furthermore, only the frequency components of the first current C1 whose frequency is equal, to within 10%, to a third frequency f3 of a pillar 40 passed through by a second current C2 lead to the generation, in a second current C2, of a second frequency component c2.

The method therefore also allows filtering of the signal transmitted to the devices.

In a second example method for generating two currents C2, during the step 120 for generating a second current C2, certain second currents C2 are not generated.

The method then makes it possible to selectively supply only some of the devices with the second frequency component c2.

In a third example frequency distributor 10, the first set E1 comprises at least a first pillar 40 and a second pillar 40.

The elements identical to the first example frequency distributor of FIG. 1 are not described again. Only the differences are shown.

The first pillar 40 has a first resonance frequency f0. The second pillar 40 has a second resonance frequency f0.

The ratio between twice the first resonance frequency f0 and the first frequency f1 is equal, to within 10%, to a third natural integer n3. The ratio between twice the second resonance frequency f0 and the first frequency f1 is equal, to within 10%, to a fourth natural integer n4.

The operation of the third example frequency distributor 10 is identical to the operation of the first example frequency distributor 10 of FIG. 1.

During step 140 for generating a second frequency component c2, the first pillar 40 and the second pillar 40 each generate a second frequency component c2 in the corresponding second current C2.

The second frequency component c2 generated by the first pillar 40 has the first resonance frequency f0.

The second frequency component c2 generated by the second pillar 40 has the second resonance frequency f0.

The method then makes it possible to supply, from a same first current C1, different electronic devices with second currents C2 having different second frequencies f2.

The invention claimed is:

1. A method for generating, from a first electric current including at least a first frequency component having a first frequency, a plurality of second currents each having a second respective frequency component, the method comprising the following steps:
   supplying a frequency distributor including:
      a first set of pillars, each pillar comprising a stack of layers superimposed in a stacking direction, the stack comprising at least:
         a free layer made from a first magnetic material,
         a fixed layer made from a second magnetic material, and
         a barrier layer made from a third nonmagnetic material, the barrier layer separating the free layer from the fixed layer in the stacking direction,
      at least one control member able to generate a second electric current,
      a coupling member, and
      a plurality of electrical output conductors, each electrical output conductor being able to supply an electrical device with a respective second electric current,
      being able, when the pillar is passed through by a direct current and is not excited by the coupling member, to generate, in the direct current, a third frequency component having a frequency called resonance frequency of said pillar,
   generating a plurality of second electric currents, each pillar of the first set being passed through by a second respective current in the stacking direction,
   exciting, by the coupling member, each pillar of the first set with an electromagnetic field having the first frequency, the ratio between twice the resonance frequency of each pillar of the first set and the first frequency being equal, to within ten percent, to a first natural integer,
   generating, by each pillar of the first set, a second frequency component in the second respective current, and
   supplying, with each second current, a corresponding electrical device via a respective output conductor.

2. The method according to claim 1, wherein each pillar has a first dimension in a first direction and a second dimension in a second direction perpendicular to the first direction, the first direction and the second direction each being perpendicular to the stacking direction,
   the first dimension and the second dimension each being strictly between 20 nanometers and 5 micrometers.

3. The method according to claim 1, wherein the first material has a first magnetization, the method further comprising a step for temporal variation of the first magnetization of the free layer of at least one pillar, with the resonance frequency of the corresponding pillar.

4. The method according to claim 1, wherein the first frequency component has a first amplitude, the second frequency component has a second amplitude, and a transfer function is defined for each pillar as being the ratio, in absolute value, of the first amplitude and the second amplitude, the transfer function being a function at least of the first frequency and having a plurality of local maxima, each local maximum corresponding to a third frequency equal, to within ten percent, to the ratio between twice the resonance frequency of the pillar and a second natural integer.

5. The method according to claim 1, wherein the resonance frequency of each pillar of the first set is equal to the resonance frequency of each other pillar of the first set.

6. The method according to claim 5, wherein the frequency distributor further includes a second set of pillars, the resonance frequency of each pillar of the second set being identical to the resonance frequency of each other pillar of the second set, for each pillar of the second set, the difference between the resonance frequency of a pillar of the second set and the resonance frequency of a pillar of the first set being greater in absolute value than ten percent of the resonance frequency of each pillar of the first set.

7. The method according to claim 1, wherein the first set includes at least one first pillar having a first resonance frequency and a second pillar having a second resonance frequency,
the ratio between twice the first resonance frequency and the first frequency being equal, to within ten percent, to a third natural integer, and
the ratio between twice the second resonance frequency and the first frequency being equal, to within ten percent, to a fourth natural integer different from the third natural integer.

8. The method according to claim 1, wherein the first material comprises at least one element chosen from the group made up of Co, Ni and Fe.

9. The method according to claim 1, wherein the coupling member comprises an electric coupling conductor configured to be traveled by the first current, the coupling conductor and at least one pillar being superimposed in the stacking direction.

10. The method according to claim 1, wherein each pillar is cylindrical with a circular base, each pillar having a generatrix parallel to the stacking direction.

11. The method according to claim 2, wherein the first material has a first magnetization, the method further comprising a step for temporal variation of the first magnetization of the free layer of at least one pillar, with the resonance frequency of the corresponding pillar.

12. The method according to claim 2, wherein the first frequency component has a first amplitude, the second frequency component has a second amplitude, and a transfer function is defined for each pillar as being the ratio, in absolute value, of the first amplitude and the second amplitude, the transfer function being a function at least of the first frequency and having a plurality of local maxima, each local maximum corresponding to a third frequency equal, to within ten percent, to the ratio between twice the resonance frequency of the pillar and a second natural integer.

13. The method according to claim 3, wherein the first frequency component has a first amplitude, the second frequency component has a second amplitude, and a transfer function is defined for each pillar as being the ratio, in absolute value, of the first amplitude and the second amplitude, the transfer function being a function at least of the first frequency and having a plurality of local maxima, each local maximum corresponding to a third frequency equal, to within ten percent, to the ratio between twice the resonance frequency of the pillar and a second natural integer.

14. The method according to claim 1, wherein the resonance frequency of each pillar of the first set is equal to the resonance frequency of each other pillar of the first set, wherein the first natural integer is equal to one.

15. The method according to claim 2, wherein the resonance frequency of each pillar of the first set is equal to the resonance frequency of each other pillar of the first set.

16. The method according to claim 3, wherein the resonance frequency of each pillar of the first set is equal to the resonance frequency of each other pillar of the first set.

17. The method according to claim 4, wherein the resonance frequency of each pillar of the first set is equal to the resonance frequency of each other pillar of the first set.

18. The method according to claim 2, wherein the first set includes at least one first pillar having a first resonance frequency and a second pillar having a second resonance frequency,
the ratio between twice the first resonance frequency and the first frequency being equal, to within ten percent, to a third natural integer, and
the ratio between twice the second resonance frequency and the first frequency being equal, to within ten percent, to a fourth natural integer different from the third natural integer.

19. The method according to claim 3, wherein the first set includes at least one first pillar having a first resonance frequency and a second pillar having a second resonance frequency,
the ratio between twice the first resonance frequency and the first frequency being equal, to within ten percent, to a third natural integer, and
the ratio between twice the second resonance frequency and the first frequency being equal, to within ten percent, to a fourth natural integer different from the third natural integer.

20. The method according to claim 4, wherein the first set includes at least one first pillar having a first resonance frequency and a second pillar having a second resonance frequency,
the ratio between twice the first resonance frequency and the first frequency being equal, to within ten percent, to a third natural integer, and
the ratio between twice the second resonance frequency and the first frequency being equal, to within ten percent, to a fourth natural integer different from the third natural integer.

* * * * *